United States Patent
Lee

(10) Patent No.: US 9,059,431 B2
(45) Date of Patent: Jun. 16, 2015

(54) ORGANIC LIGHT EMITTING DISPLAY

(71) Applicant: LG Display Co., Ltd., Seoul (KR)

(72) Inventor: Se-Hee Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/079,769

(22) Filed: Nov. 14, 2013

(65) Prior Publication Data

US 2014/0145163 A1      May 29, 2014

(30) Foreign Application Priority Data

Nov. 27, 2012   (KR) .................. 10-2012-0135601

(51) Int. Cl.
| | | |
|---|---|---|
| *H01L 35/24* | (2006.01) | |
| *H01L 51/52* | (2006.01) | |
| *H01L 27/32* | (2006.01) | |
| *H01L 51/50* | (2006.01) | |

(52) U.S. Cl.
CPC ......... *H01L 51/5265* (2013.01); *H01L 51/5056* (2013.01); *H01L 27/3211* (2013.01)

(58) Field of Classification Search
CPC ......... H01L 33/50; H01L 33/58; H01L 33/60; H01L 21/02521; H01L 21/02546; H01L 21/02579; H01L 21/0262; H01L 21/02642; H01L 21/02647; H01L 33/007; H01L 33/641; H01L 21/0237; H01L 21/0242; H01L 21/02458; H01L 33/36; H01L 33/64; H01L 21/0254; Y10S 977/742
USPC ............... 257/12–13, 81, 84, 87–89, 98–100, 257/347–348, 433–434; 313/12–13, 81, 84, 313/87–89, 98–100, 347–348, 433–434
See application file for complete search history.

(56) References Cited

U.S. PATENT DOCUMENTS

2013/0140535 A1*   6/2013  Chu et al. .................. 257/40

* cited by examiner

*Primary Examiner* — Dung Le
(74) *Attorney, Agent, or Firm* — Fenwick & West LLP

(57) ABSTRACT

An organic light emitting display includes first and second electrodes facing each other on a substrate, a red light emitting layer, a green light emitting layer and a blue light emitting layer formed between the first and second electrodes, a hole-transporting layer formed between the first electrode and each of the red light emitting layer, the green light emitting layer and the blue light emitting layer, and an electron-transporting layer formed between the second electrode and each of the red light emitting layer, the green light emitting layer and the blue light emitting layer, wherein a gap between a photo-luminescence (PL) peak maximum of the red host of the red light emitting layer and a photo-luminescence (PL) peak maximum of the electron-transporting layer contacting the red light emitting layer is within ±25 nm.

12 Claims, 6 Drawing Sheets

$$|ETL_{PLmax} - RH_{PLmax}| \leq 25nm$$

ORGANIC LIGHT EMITTING DISPLAY

This application claims the benefit of Korean Patent Application No. 10-2012-0135601, filed on Nov. 27, 2012 which is hereby incorporated by reference in its entirety.

BACKGROUND OF THE INVENTION

1. Field of the Invention

The present invention relates to an organic light emitting display to improve a contrast ratio and prevent roll-off at a low gray scale.

2. Discussion of the Related Art

The recent advent of information-dependent age has brought about rapid development in the display field that visually displays electrical information signals. In this regard, a variety of flat panel displays having superior properties such as slimness, light weight and low power consumption have been developed.

Examples of flat panel displays include liquid crystal displays (LCDs), plasma display panels (PDPs), field emission displays (FEDs), organic light emitting displays (OLEDs), and the like.

In particular, an organic light emitting display spontaneously emits light, which has advantages of rapid response speed, superior luminous efficacy, excellent brightness and wide viewing angle, as compared to other flat panel displays. Such an organic light emitting display includes an anode and a cathode which face each other such that a light emitting layer is interposed therebetween. Holes injected from the anode recombine with electrons injected from the cathode in a light emitting layer to form electron-hole pairs, i.e., excitons. When the excitons transition to a ground state, energy is released. Based on this energy, the organic light emitting display emits light.

However, conventional organic light emitting displays have a disadvantage of deterioration in contrast ratio caused by leaked current flowing in light emitting cells during a non-display term of the light emitting cells.

Specifically, when a red light emitting layer of red light emitting cells is formed of a phosphorescent material, the red light emitting layer easily emits light due to considerably high quantum efficiency in spite of low leakage current at a zero gray scale rendering black. In this case, although only the red light emitting cell emits light, the same effects as when green and blue light emitting cells disposed at both sides of the red light emitting cell emit light at a zero gray scale are obtained. As a result, the green and blue light emitting cells as well as the red light emitting cell have disadvantages of deterioration in contrast ratio.

In addition, when the red light emitting layer is formed of a phosphorescent material, the red light emitting layer has the highest efficiency, as compared to green and blue light emitting layers, thus disadvantageously causing a roll-off phenomenon. That is, as shown in FIG. 1, a roll-off phenomenon in which efficiency of the red light emitting layer gradually decreases from a low current to a high current occurs. In particular, an efficiency is high and suddenly decreases at a low gray scale. Accordingly, in a conventional organic light emitting display, at a low gray scale, it is disadvantageously difficult to form a gamma curve showing variation in efficiency of the red light emitting layer with respect to a gray scale.

SUMMARY OF THE INVENTION

Accordingly, the present invention is directed to an organic light emitting display that substantially obviates one or more problems due to limitations and disadvantages of the related art.

An object of the present invention is to provide an organic light emitting display to improve contrast ratio and prevent roll-off at a low gray scale.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an organic light emitting display includes first and second electrodes facing each other on a substrate, a red light emitting layer, a green light emitting layer and a blue light emitting layer formed between the first and second electrodes, a hole-transporting layer formed between the first electrode and each of the red light emitting layer, the green light emitting layer and the blue light emitting layer, and an electron-transporting layer formed between the second electrode and each of the red light emitting layer, the green light emitting layer and the blue light emitting layer, wherein a gap between a photo-luminescence (PL) peak maximum of the red host of the red light emitting layer and a photo-luminescence (PL) peak maximum of the electron-transporting layer contacting the red light emitting layer is within ±25 nm.

The red light emitting layer may include the red host having a content higher than 50% and a red dopant having a content lower than 50%, the electron-transporting layer may be formed of two or more materials, and a gap between the photo-luminescence (PL) peak maximum of the red host of the red light emitting layer, and a photo-luminescence (PL) peak maximum of a material occupying half or more the electron-transporting layer may be ±25 nm.

The red host may have a photo-luminescence (PL) peak maximum of 455 nm to 470 nm, and may be formed of a Be complex such as $BeBq_2$, CBP, CDBP, $Balq_3$, $Alg_3$, mCP, BCP, TAZ or UGH.

The electron-transporting layer may have a photo-luminescence (PL) peak maximum of 435 nm to 495 nm, and may have a structure represented by the following Formula 1.

[Formula 1]

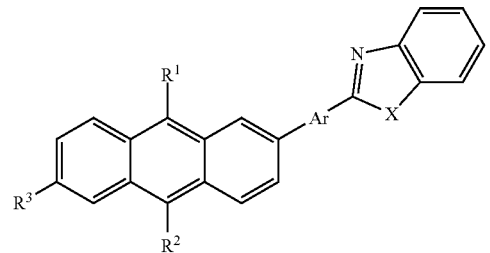

wherein $R^1$ and $R^2$ independently represent a hydrogen atom, aliphatic hydrocarbon having 1 to 20 carbon atoms, phenyl, naphthyl, biphenyl, anthracenyl, or a group derived from aromatic heterocycles or aromatic cycles, at least one of $R^1$ and $R^2$ represents phenyl, naphthyl, biphenyl, or a group derived from aromatic heterocycles or cycles, Ar represents phenyl, naphthyl, biphenyl, anthracenyl or a group derived from aromatic heterocycles or aromatic cycles, $R^3$ represents a hydrogen atom, an alkyl group having 1 to 6 carbon atoms or aliphatic hydrocarbon having 1 to 6 carbon atoms, substituted phenyl, naphthyl, biphenyl, anthracenyl, or an aromatic heterocycle or cycle, X represents $NR_4$, a sulfur atom or an oxygen atom, and $R^4$ represents a hydrogen atom, an alkyl group having 1 to 7 carbon atoms or aliphatic hydrocarbon having 1 to 7 carbon atoms, phenyl, naphthyl, biphenyl, anthracenyl, or a group derived from aromatic heterocycles or aromatic cycles.

The electron-transporting layer may have a photo-luminescence (PL) peak maximum of 435 nm to 495 nm, and may have a structure represented by any one of the following Formulae 2 to 5.

[Formula 2]

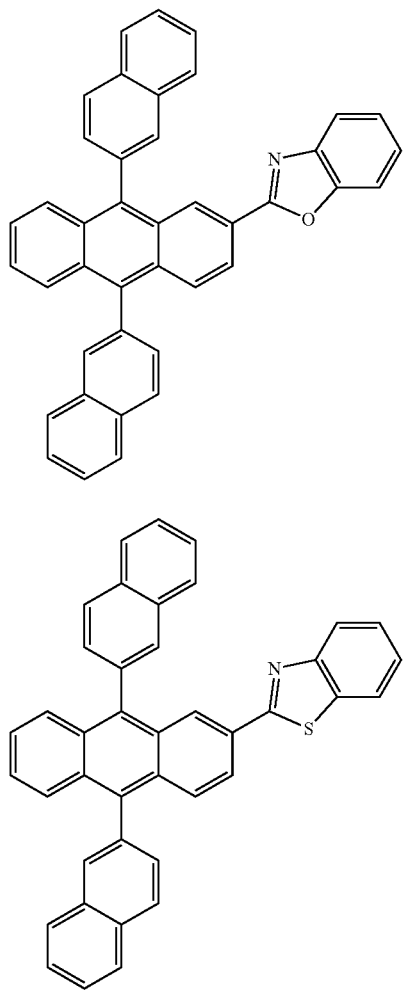

[Formula 3]

[Formula 4]

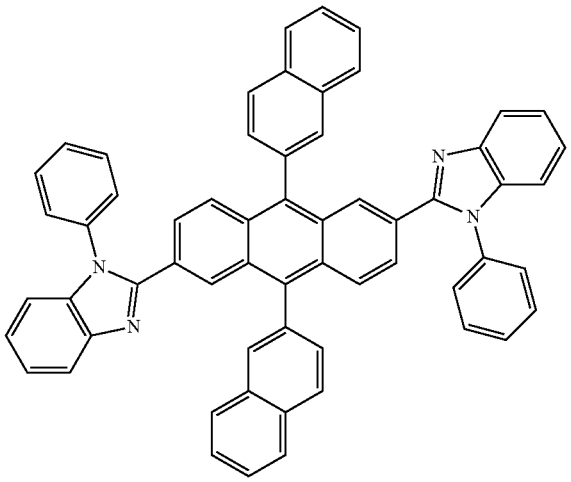

[Formula 5]

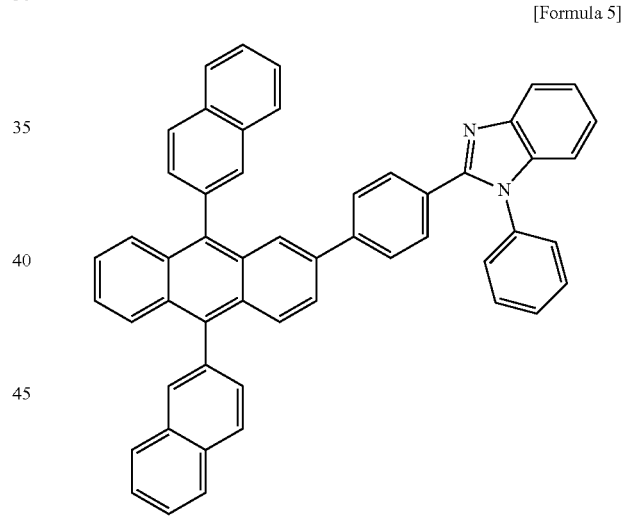

The electron-transporting layer may have a photo-luminescence (PL) peak maximum of 435 nm to 495 nm, and may have a structure represented by any one of the following Formulae 6 and 7.

[Formula 6]

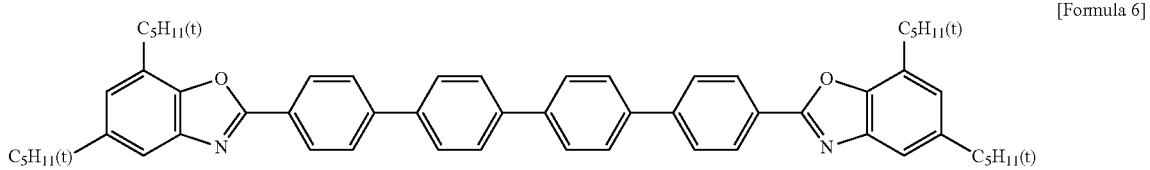

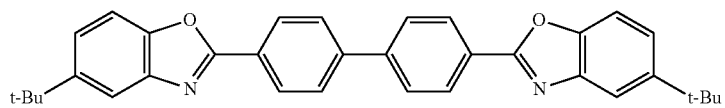

[Formula 7]

The second electrode may have a monolayer or multilayer structure, each layer may be formed of a metal, an inorganic material, a mixture of two metals, a mixture of a metal and an inorganic material, or a combination thereof, a ratio of the metal and the inorganic material may be 10:1 to 1:10, when each layer is formed of the mixture of the metal and the inorganic material, and a ratio between the two metals may be 10:1 to 1:10, when each layer is formed of the mixture of the two metals.

The metal may include Ag, Mg, Yb, Li or Ca, and the inorganic material may include $LiO_2$, CaO, LiF or $MgF_2$.

The second electrode may have a thickness of 100 to 400 Å and a sheet resistance of 15Ω per square or less, and the second electrode may have a work function of 3 to 5.3 eV.

The organic light emitting display may further include a front sealing layer including one or more organic layers and one or more inorganic layers alternately and repeatedly formed on the second electrode.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and simultaneously with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 1:
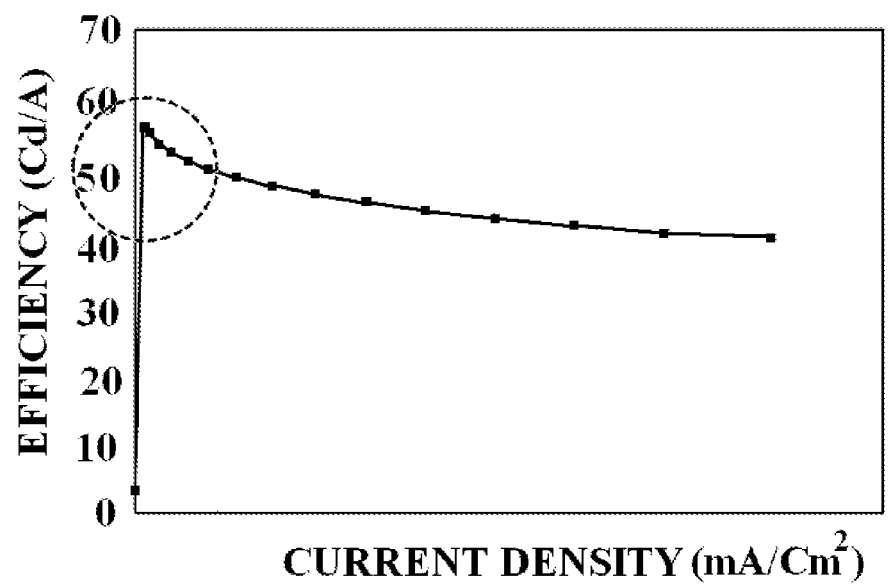
FIG. 1 is a graph showing efficiency with respect to current density, in a conventional organic light emitting display.
Figure 2:
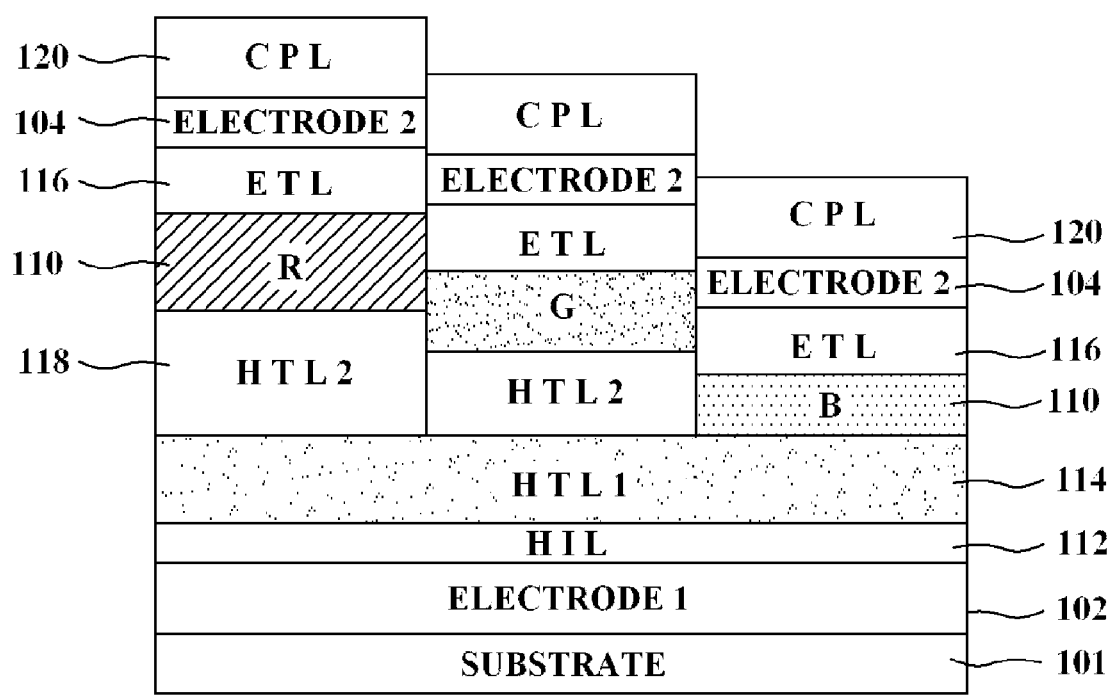
FIG. 2 is a sectional view illustrating an organic light emitting display according to the present invention.

FIG. 2 is a sectional view illustrating an organic light emitting display according to one embodiment of the present invention.

The organic light emitting display shown in FIG. 2 includes red, green and blue light emitting cells formed on a substrate 101.

Each of the red, green and blue light emitting cells further includes a first electrode 102, a hole injection layer 112, a hole-transporting layer 114, a light emitting layer 110, an electron-transporting layer 116, a second electrode 104 and a front sealing layer 120 formed on the substrate 101 in this order. In addition, each of the red and green light emitting cells further includes a second hole-transporting layer 118 formed between the hole-transporting layer 114 and the light emitting layer 110.

At least one of the first and second electrodes 102 and 104 is formed of a transparent electrode. When the first electrode 102 is a transparent electrode and the second electrode 104 is a non-transparent electrode, the organic light emitting display has a rear-surface light emission structure in which light is emitted downward. When the second electrode 104 is a transparent electrode and the first electrode 102 is a non-transparent electrode, the organic light emitting display has a front-surface light emission structure in which light is emitted upward. When both the first and second electrodes 102 and 104 are transparent electrodes, the organic light emitting display has a double-surface light emission structure in which light is emitted upward and downward. In the present invention, an example in which the first electrode 102 is formed of a transparent electrode as an anode and the second electrode 104 is formed of a non-transparent electrode as a cathode will be described.

The first electrode 102 is formed as a transparent electrode using indium tin oxide (hereinafter referred to as ITO), indium zinc oxide (hereinafter referred to as IZO) or the like.

The second electrode 104 has a monolayer or multilayer structure and respective layers constituting the second electrode 104 are formed of a metal, an inorganic material, a mixture of two types of metals, a mixture of a metal and an inorganic material, or a combination thereof. When each layer is formed of a mixture of a metal and an inorganic material, a ratio therebetween is 10:1 to 1:10, and when each layer is formed of a mixture of the metals, a ratio therebetween is 10:1 to 1:10. The metal constituting the second electrode 104 is Ag, Mg, Yb, Li or Ca, and the inorganic material is formed of $Li_2O$, CaO, LiF or $MgF_2$, aids electron movement and enables more electrons to be transported into the light emitting layer 110.

The second electrode 104 has a thickness of 100 to 400 Å, a sheet resistance of 15Ω per square or less and a work function of 3 to 5.3 eV.

The hole injection layer 112 supplies holes from the first electrode 102 to the first and second hole-transporting layers 114 and 118. The first and second hole-transporting layers 114 and 118 supply holes from the hole injection layer 112 to the light emitting layer 110 of the respective light emitting cells. The red (R) light emitting cell is the thickest, the blue (B) light emitting cell is the thinnest and the green (G) light emitting cell is thicker than the blue (B) light emitting cell and thinner than the red (R) light emitting cell. By controlling the thickness of the second hole-transporting layer 118 and inducing constructive interference of emitted light in each light emitting cell, vertical luminous efficacy in each light emitting cell can be optimized.

The front sealing layer 120 functions to block permeation of exterior moisture or oxygen, thereby improving reliability. For this purpose, the front sealing layer 120 has a structure including one or more organic layers and one or more inorganic layers alternately and repeatedly formed. The inorganic layer is formed of at least one of aluminum oxide ($Al_xO_x$), silicon oxide ($SiO_x$), $SiN_x$, SiON and LiF in order to primarily block permeation of exterior moisture or oxygen. The organic layer secondarily blocks permeation of exterior moisture or oxygen. In addition, the organic layer functions to offset stress between respective layers generated by bending of the organic light emitting display and to enhance evenness. Such an organic layer is formed of an acryl resin, an epoxy resin, or a polymer such as polyimide or polyethylene.

Figure 3A:
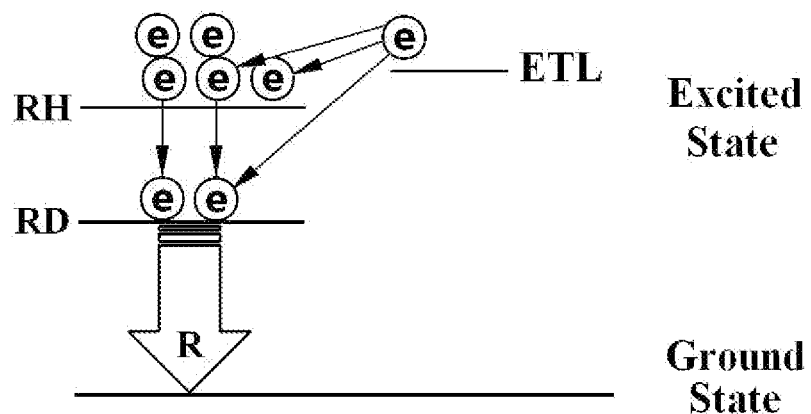
FIGS. 3A and 3B show movement passages of electrons from an electron-transporting layer to a red light emitting layer in a conventional organic light emitting display and an organic light emitting display according to the present invention.
Figure 3B:
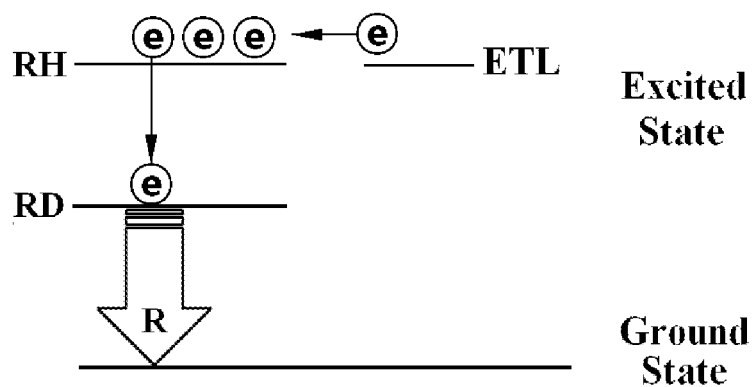

FIGS. 3A and 3B show movement passages of electrons from an electron-transporting layer to a red light emitting layer in a conventional organic light emitting display and an organic light emitting display according to the present invention.

As shown in FIG. 3A, an excited state energy of a red host RH of the red (R) light emitting layer 110 of the conventional organic light emitting display is lower than that of the electron-transporting layer (116; ETL). In this case, a gap between the excited state energy of the red host RH and the excited state energy of the red dopant RD decreases and electrons often directly move from the electron-transporting layer 116 to the red dopant RD, while not passing through the red host RH. In this case, when a small amount of electrons are injected at an initial low current, electrons are directly injected into the red dopant from the electron-transporting layer 116 and high efficiency is thus obtained, but electrons are accumulated due to increased current and thus increase in electron amount, and luminous efficacy with respect to an initial low current decreases.

Meanwhile, as shown in FIG. 3B, an excited state energy of the red host RH of the red light emitting layer 110 of the organic light emitting display according to the present invention is similar to the excited state energy of the electron-transporting layer (116; ETL) thereof. Preferably, the excited state energy of the red host RH is the same as the excited state energy of the electron-transporting layer (116; ETL). In this case, a gap between the excited state energy of the red host RH and the excited state energy of the red dopant RD is greater than in a conventional case, and electrons from the electron-transporting layer 116 do not directly move to the red dopant RD and move through the red host RH to the red dopant RD. Accordingly, an electron movement passage when a small number of electrons are injected at a low current becomes the same as an electron movement passage when a great number of electrons are injected at a high current. That is, at low and high currents, electrons of the electron-transporting layer 116 move at a constant speed through the red host RH to the red dopant RD, variation in amount of electrons injected into the light emitting layer 110 is kept and formation of excitons according to increased current can thus be maintained. Accordingly, in the present invention, a constant luminous efficacy is obtained at low and high currents and roll-off can be prevented at a low gray scale.

As such, in order to make an excited state energy of the red host of the red light emitting layer 110 of the organic light emitting display according to the present invention be the same as the excited state energy of the electron-transporting layer 116, as depicted by Equation 1, photo-luminescence (PL) peak maximum ($\lambda_{max}$) of the electron-transporting layer 116 ($ETL_{PLmax}$) and PL peak maximum ($\lambda_{max}$) of the red light emitting layer 110 ($RH_{PLmax}$) are adjacent to each other within 25 nm. The red light emitting layer 110 is formed of a red host having a content greater than 50% and a red dopant having a content less than 50%, and the electron-transporting layer 116 is formed of two or more materials. In this case, a gap between the photo-luminescence (PL) peak maximum ($\lambda_{max}$, $RH_{PLmax}$) of the red host of the red light emitting layer 110, and PL peak maximum ($\lambda_{max}$, $ETL_{PLmax}$) of a material occupying half or more the electron-transporting layer 116 is within ±25 nm, as depicted by Equation 1.

$$|ETL_{PLmax} - RH_{PLmax}| \leq 25 \text{ nm} \quad \text{[Equation 1]}$$

For example, the electron-transporting layer 116 has a photo-luminescence (PL) peak maximum of 435 nm to 495 nm, preferably a photo-luminescence (PL) peak maximum of about 460 nm.

The electron-transporting layer 116 is formed of a material represented by Formula 1.

[Formula 1]

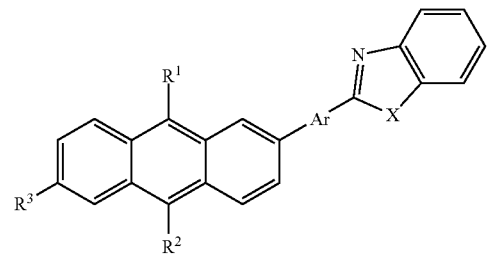

In Formula 1, $R^1$ and $R^2$ each independently represent a hydrogen atom, aliphatic hydrocarbon having 1 to 20 carbon atoms, phenyl, naphthyl, biphenyl, anthracenyl, or a group derived from aromatic heterocycles or aromatic cycles, at least one of $R^1$ and $R^2$ represents phenyl, naphthyl, biphenyl, or a group derived from aromatic heterocycles or cycles, Ar represents phenyl, naphthyl, biphenyl, anthracenyl or a group derived from aromatic heterocycles or aromatic cycles, $R^3$ represents a hydrogen atom, an alkyl group having 1 to 6 carbon atoms or aliphatic hydrocarbon having 1 to 6 carbon atoms, substituted phenyl, naphthyl, biphenyl, anthracenyl, Or an aromatic heterocycle or cycle, X represents $NR_4$, a sulfur atom or an oxygen atom, and $R^4$ represents a hydrogen atom, an alkyl group having 1 to 7 carbon atoms or aliphatic hydrocarbon having 1 to 7 carbon atoms, phenyl, naphthyl, biphenyl, anthracenyl, or a group derived from aromatic heterocycles or aromatic cycles.

By obtaining various derivatives represented by Formulas 2 to 5 using Formula 1, the photo-luminescence (PL) peak maximum of the electron-transporting layer 116 can be changed.

[Formula 2]
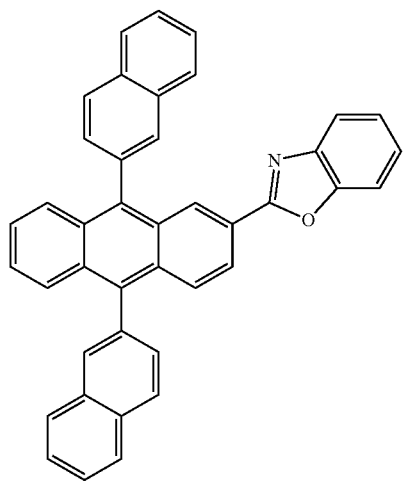
[Formula 3]
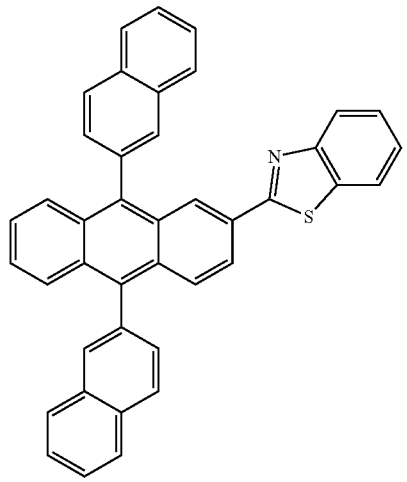
[Formula 4]
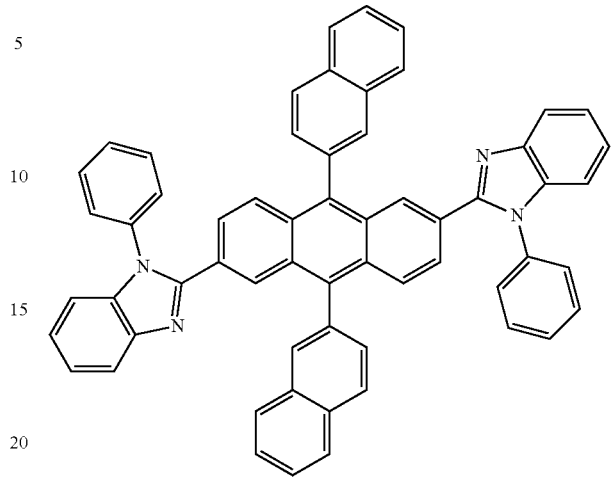
[Formula 5]
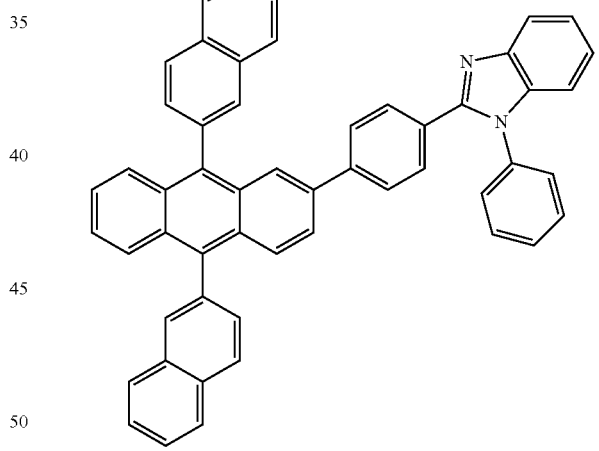
Further, the electron-transporting layer 116 is formed of a material represented by Formula 6 or 7.
[Formula 6]
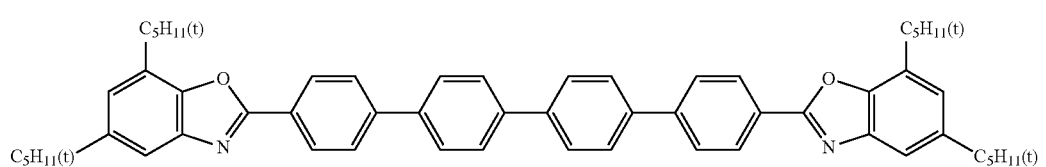

-continued

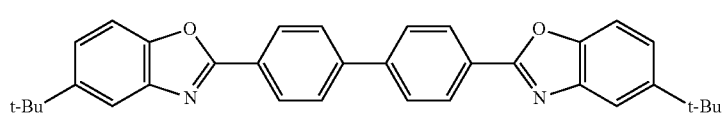
[Formula 7]

In addition, the red host has a photo-luminescence (PL) peak maximum of 455 nm to 470 nm and is formed of a Be complex such as $BeBq_2$ represented by Formula 8, CBP represented by Formula 9, CDBP, $Balq_3$ represented by Formula 10, Alq3, mCP, BCP, TAZ represented by Formula 11 or UGH.

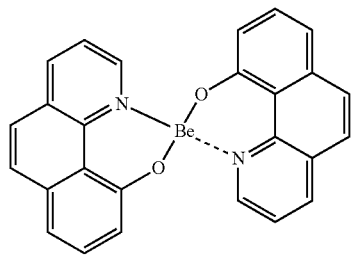
[Formula 8]

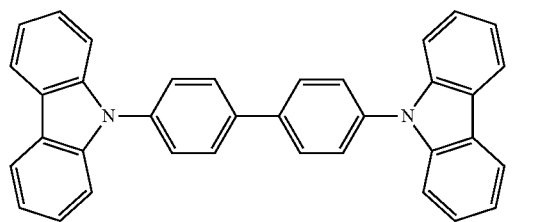
[Formula 9]

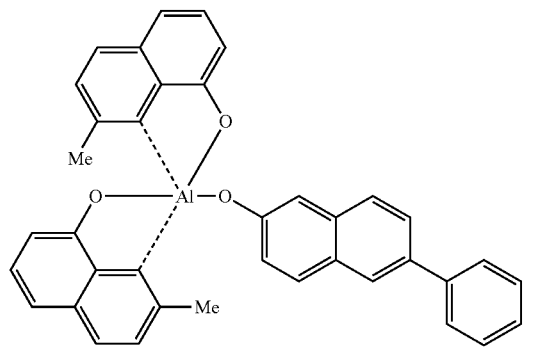
[Formula 10]

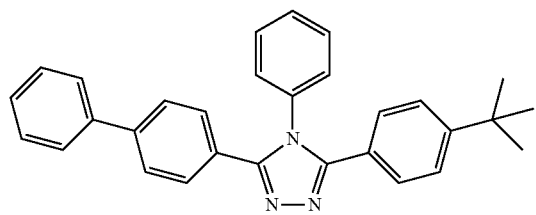
[Formula 11]

Figure 4:
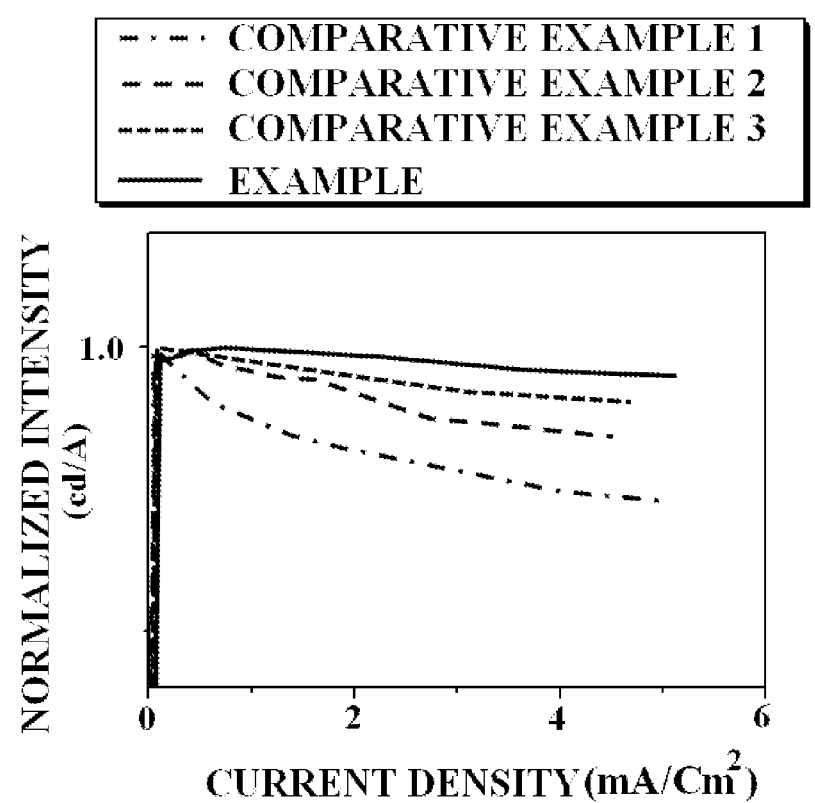
FIG. 4 is a graph showing efficiency with respect to current density in a conventional organic light emitting display.

FIG. 4 is a graph showing efficiency with respect to current density, regarding Examples according to the present invention and Comparative Examples.

In FIG. 4, Comparative Example 1 has a red host photo-luminescence (PL) peak maximum (PL_max) of 525 nm, Comparative Example 2 has a red host photo-luminescence (PL) peak maximum (PL_max) of 500 nm, Comparative Example 3 has a red host photo-luminescence (PL) peak maximum (PL_max) of 470 nm, Example according to the present invention has a red host photo-luminescence (PL) peak maximum (PL_max) of 455 nm, and Comparative Examples 1 to 3 and Example use a material for the electron-transporting layer having a photo-luminescence (PL) peak maximum (PL_max) of 460 nm.

As shown in FIG. 4, Comparative Examples 1 to 3 undergo a roll-off phenomenon in which efficiency is high at low current, but then rapidly decreases, while Example according to the present invention exhibits a predetermined luminous efficacy at low and high currents and thus prevents the roll-off phenomenon.

Figure 5A:
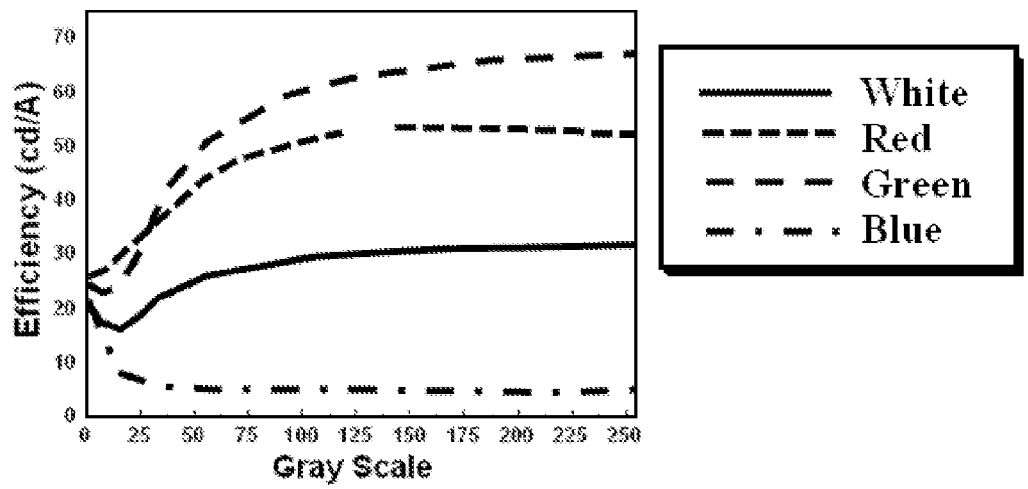
FIGS. 5A and 5B are graphs showing efficiency with respect to gray scale, regarding a conventional organic light emitting display and an organic light emitting display according to the present invention.
Figure 5B:
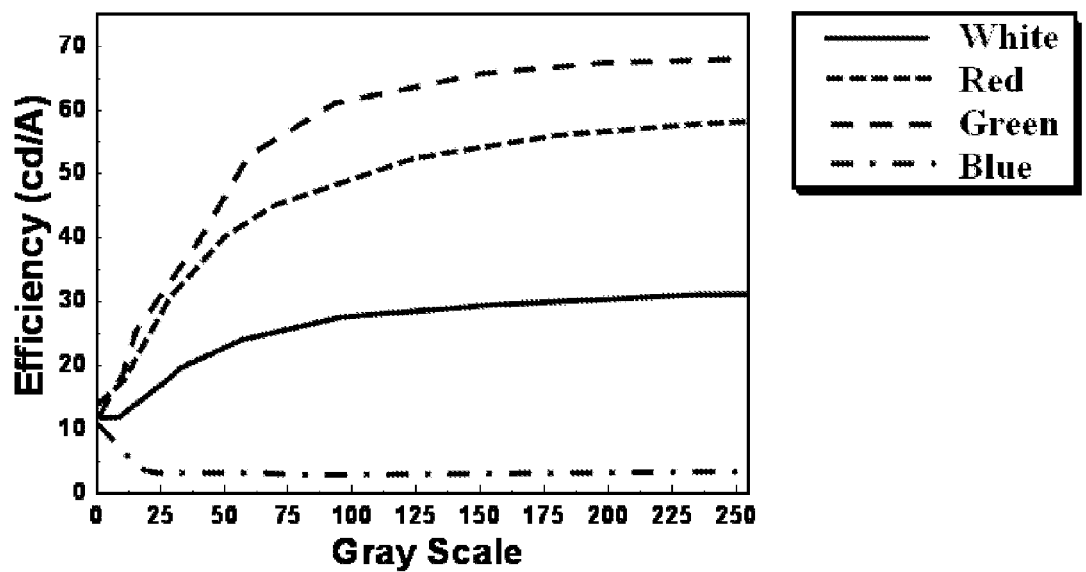

FIG. 5A is a graph showing efficiency with respect to gray scale, regarding Comparative Example 2 and FIG. 5B is a graph showing efficiency with respect to gray scale, regarding Example according to the present invention.

As shown in FIG. 5A, in a case of Comparative Example 2, at a low gray scale (for example, 1 gray scale), the red light emitting cell, the green light emitting cell and the blue light emitting cell emit light at a relatively high efficiency of 20 cd/A or more. On the other hand, as shown in FIG. 5B, in a case of Example according to the present invention, at a low gray scale (for example, 1 gray scale), the red light emitting cell, the green light emitting cell and the blue light emitting cell emit light at an efficiency lower than 15 cd/A which is lower than that of Comparative Example 2. This demonstrates that the present invention exhibits improved contrast ratio, as compared to Comparative Example.

Figure 6A:
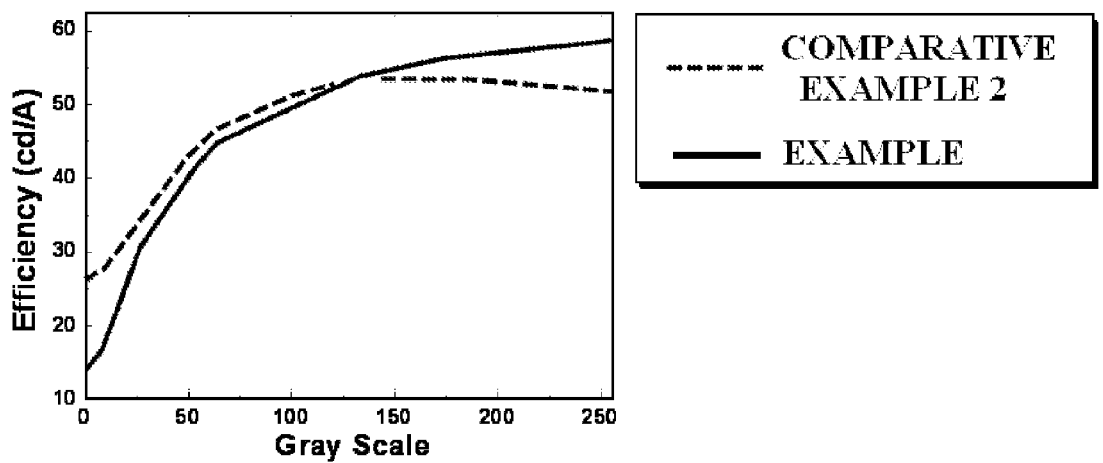
FIGS. 6A and 6B are graphs showing efficiency with respect to gray scale, regarding Comparative Example 2 and Example according to the present invention.
Figure 6B:
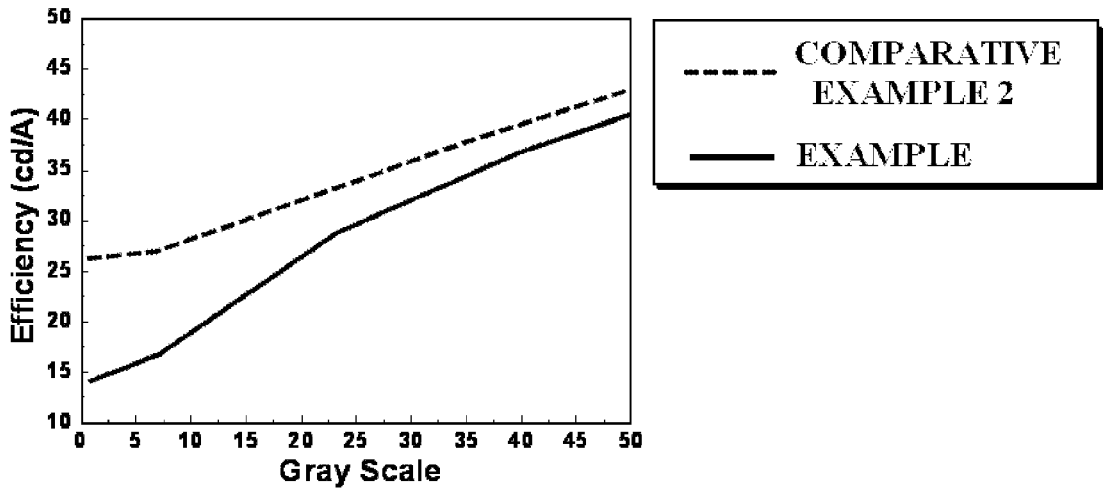

In particular, as shown in FIGS. 6A and 6B, at a low gray scale of 50 or less, Comparative Example 2 has no great difference in efficiency depending on gray scale, entails a difficulty of formation of gamma curve according to gray scale and thus disadvantageously causes deterioration in color reproduction accuracy according to brightness. On the other hand, Example has great difference in efficiency according to gray scale, enables easy formation of gamma curve according to gray scale and thus improves color reproduction accuracy according to brightness.

According to the organic light emitting display of the present invention, energy of the red host of the red light emitting layer is the same as that of the electron-transporting layer, variation in amount of electrons injected into the light emitting layer is kept and roll-off can thus be prevented at a low gray scale. In addition, the organic light emitting display according to the present invention can reduce efficiency at a black gray scale, as compared to conventional organic light emitting displays, thus improving contrast ratio.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic light emitting display comprising:
   a first electrode and a second electrode facing each other on a substrate;
   a red light emitting layer, a green light emitting layer and a blue light emitting layer formed between the first electrode and the second electrode;
   a hole-transporting layer between the first electrode and each of the red light emitting layer, the green light emitting layer and the blue light emitting layer; and
   an electron-transporting layer between the second electrode and each of the red light emitting layer, the green light emitting layer and the blue light emitting layer,
   wherein a gap between a photo-luminescence (PL) peak maximum of a red host of the red light emitting layer and a photo-luminescence (PL) peak maximum of the electron-transporting layer contacting the red light emitting layer is within ±25 nm.

2. The organic light emitting display according to claim 1, wherein:
   the red light emitting layer comprises greater than 50% of the red host and less than 50% of a red dopant; and
   the electron-transporting layer includes two or more materials, wherein
   a gap between the photo-luminescence (PL) peak maximum of the red host and a photo-luminescence (PL) peak maximum of a material comprising half or more of the electron-transporting layer is ±25 nm.

3. The organic light emitting display according to claim 2, wherein the red host has a photo-luminescence (PL) peak maximum of 455 nm to 470 nm, and comprises a Be compound selected from the group consisting of $BeBq_2$, CBP, CDBP, $Balq_3$, $Alq_3$, mCP, BCP, TAZ, and UGH.

4. The organic light emitting display according to claim 3, wherein the electron-transporting layer has a photo-luminescence (PL) peak maximum of 435 nm to 495 nm, and includes a molecule having a structure represented by Formula 1.

[Formula 1]

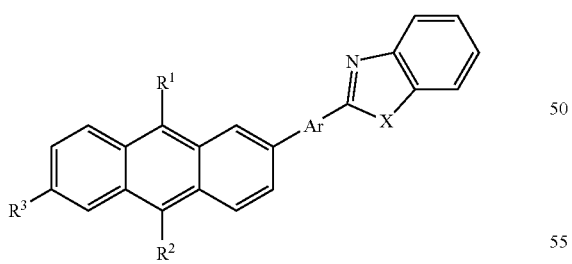

wherein $R^1$ and $R^2$ each independently represents a hydrogen atom, aliphatic hydrocarbon having 1 to 20 carbon atoms, phenyl, naphthyl, biphenyl, anthracenyl, or aromatic heterocycles or aromatic cycles, at least one of $R^1$ and $R^2$ represents phenyl, naphthyl, biphenyl, oraromatic heterocycles or cycles;

Ar represents phenyl, naphthyl, biphenyl, anthracenyl or aromatic heterocycles or aromatic cycles;
$R^3$ represents a hydrogen atom, an alkyl group having 1 to 6 carbon atoms or aliphatic hydrocarbon having 1 to 6 carbon atoms, substituted phenyl, naphthyl, biphenyl, anthracenyl, or an aromatic heterocycle or cycle;
X represents $NR_4$, a sulfur atom or an oxygen atom; and
$R^4$ represents a hydrogen atom, an alkyl group having 1 to 7 carbon atoms or aliphatic hydrocarbon having 1 to 7 carbon atoms, phenyl, naphthyl, biphenyl, anthracenyl, or aromatic heterocycles or aromatic cycles.

5. The organic light emitting display according to claim 3, wherein the electron-transporting layer has a photo-luminescence (PL) peak maximum of 435 nm to 495 nm, and has a structure represented by any one of the following Formulae 2 to 5

[Formula 2]

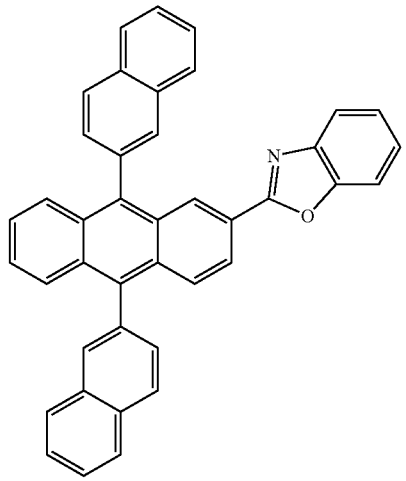

[Formula 3]

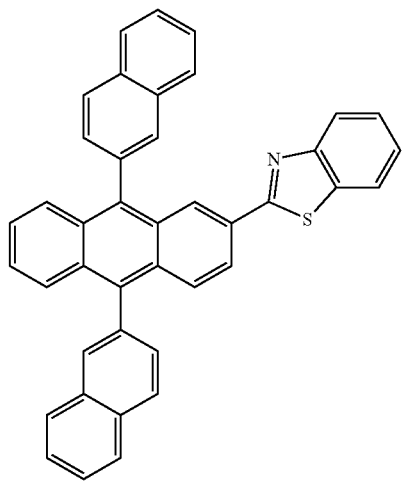

[Formula 4]

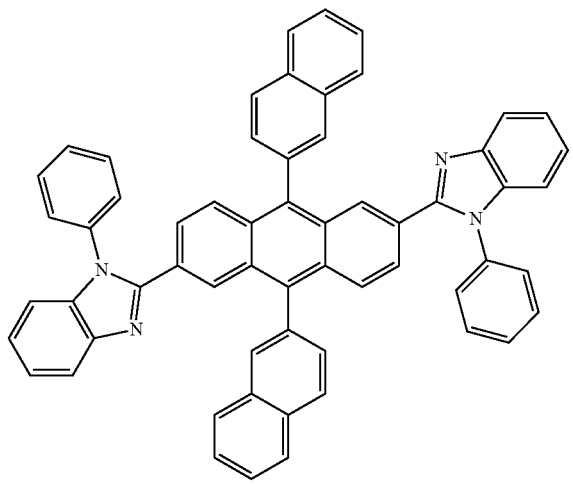

[Formula 5]

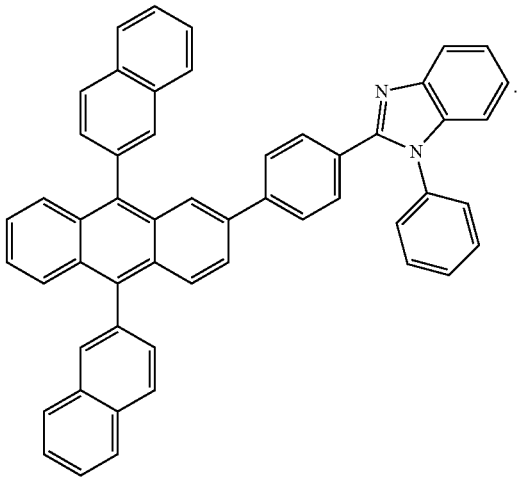

6. The organic light emitting display according to claim 3, wherein the electron-transporting layer has a photo-luminescence (PL) peak maximum of 435 nm to 495 nm, and has a structure represented by any one of the following Formulae 6 and 7.

[Formula 6]

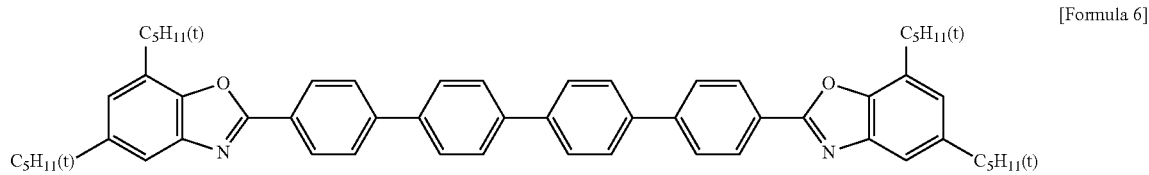

[Formula 7]

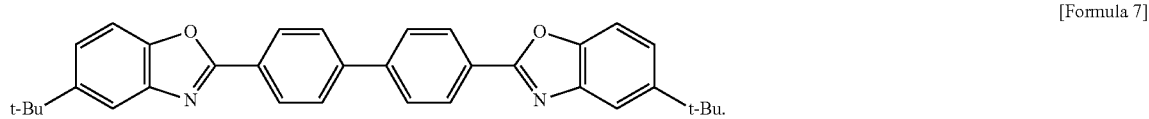

7. The organic light emitting display according to claim 1, wherein the second electrode includes one or more layers, each layer is formed of a metal, an inorganic material, a mixture of two metals, a mixture of a metal and an inorganic material, or a combination thereof.

8. The organic light emitting display according to claim 7, wherein a ratio of the metal to the inorganic material of the mixture of the metal and the inorganic material is 10:1 to 1:10.

9. The organic light emitting display according to claim 7, wherein a ratio of the two metals to each other of the mixture of the two metals is 10:1 to 1:10.

10. The organic light emitting display according to claim 7, wherein the metal comprises Ag, Mg, Yb, Li or Ca, and the inorganic material comprises $LiO_2$, CaO, LiF or $MgF_2$.

11. The organic light emitting display according to claim 7, wherein the second electrode has a thickness of 100 Å to 400 Å, a sheet resistance of 15Ω per square or less, and a work function of 3 eV to 5.3 eV.

12. The organic light emitting display according to claim 1, further comprising a front sealing layer including one or more organic layers and one or more inorganic layers alternately and repeatedly formed on the second electrode.

* * * * *